United States Patent
Pirkl

(10) Patent No.: US 9,411,029 B2
(45) Date of Patent: Aug. 9, 2016

(54) MAGNETIC RESONANCE TOMOGRAPHY SYSTEM, RECEIVE APPARATUS AND METHOD

(71) Applicant: Georg Pirkl, Dormitz (DE)

(72) Inventor: Georg Pirkl, Dormitz (DE)

(73) Assignee: Siemens Aktiengesellschaft, München (DE)

( * ) Notice: Subject to any disclaimer, the term of this patent is extended or adjusted under 35 U.S.C. 154(b) by 728 days.

(21) Appl. No.: 13/675,950

(22) Filed: Nov. 13, 2012

(65) Prior Publication Data

US 2013/0119982 A1 May 16, 2013

(30) Foreign Application Priority Data

Nov. 14, 2011 (DE) .......................... 10 2011 086 288

(51) Int. Cl.
- *G01V 3/00* (2006.01)
- *G01R 33/36* (2006.01)
- *G01R 33/54* (2006.01)
- *G01R 33/422* (2006.01)

(52) U.S. Cl.
CPC ............ *G01R 33/3621* (2013.01); *G01R 33/54* (2013.01); *G01R 33/3692* (2013.01); *G01R 33/422* (2013.01)

(58) Field of Classification Search
CPC .................................... G01R 33/3621
USPC .................................. 324/309, 306
See application file for complete search history.

(56) References Cited

U.S. PATENT DOCUMENTS

| | | | |
|---|---|---|---|
| 4,949,040 A | 8/1990 | Proksa et al. | |
| 5,170,123 A * | 12/1992 | Holland et al. | 324/322 |
| 5,739,691 A * | 4/1998 | Hoenninger, III | 324/322 |
| 6,297,637 B1 * | 10/2001 | Feld et al. | 324/322 |
| 6,339,717 B1 | 1/2002 | Baumgartl et al. | |
| 6,977,502 B1 | 12/2005 | Hertz | |
| 2005/0099182 A1* | 5/2005 | Park et al. | 324/322 |
| 2007/0224698 A1 | 9/2007 | Jesmanowicz | |
| 2009/0286478 A1 | 11/2009 | Biber et al. | |
| 2010/0260293 A1 | 10/2010 | Roeven | |
| 2011/0109315 A1 | 5/2011 | Biber et al. | |

(Continued)

FOREIGN PATENT DOCUMENTS

| | | |
|---|---|---|
| CN | 101581771 A | 11/2009 |
| CN | 102053233 A | 5/2011 |

(Continued)

OTHER PUBLICATIONS

German Office Action dated Aug. 1, 2012 for corresponding German Patent Application No. DE 10 2011 086 288.9 with English translation.

(Continued)

*Primary Examiner* — Rodney Fuller
(74) *Attorney, Agent, or Firm* — Lempia Summerfield Katz LLC

(57) ABSTRACT

A magnetic resonance tomography (MRT) system has a receive apparatus disposed in a magnetic field, in which a receive coil is coupled to an input of an analog/digital converter. The analog/digital converter is configured for this purpose. A digital output of the analog/digital converter is coupled via a digital mixer device and a clock-rate-reduction device to a data output of the receive apparatus. The mixer device is configured to mix a predetermined frequency band of the MR signal downwards into an intermediate frequency range and create a digital IF signal.

20 Claims, 1 Drawing Sheet

(56) References Cited

U.S. PATENT DOCUMENTS

| | | |
|---|---|---|
| 2012/0020259 A1* | 1/2012 | Bollenbeck et al. .......... 370/297 |
| 2012/0286787 A1* | 11/2012 | Van Liere ..................... 324/322 |
| 2012/0319884 A1* | 12/2012 | Bollenbeck et al. .......... 341/155 |
| 2014/0062480 A1* | 3/2014 | Bollenbeck et al. .......... 324/309 |
| 2014/0266190 A1* | 9/2014 | Bollenbeck et al. .......... 324/307 |

FOREIGN PATENT DOCUMENTS

| | | | |
|---|---|---|---|
| DE | 3811066 | A1 | 10/1989 |
| DE | 19911988 | A1 | 9/2000 |
| EP | 0412747A2 | A2 | 2/1991 |
| WO | WO2011073880 | A1 | 6/2011 |

OTHER PUBLICATIONS

Chinese Office action for related Chinese Application No. 201210456937.0, dated Nov. 24, 2015, with English Translation.

* cited by examiner

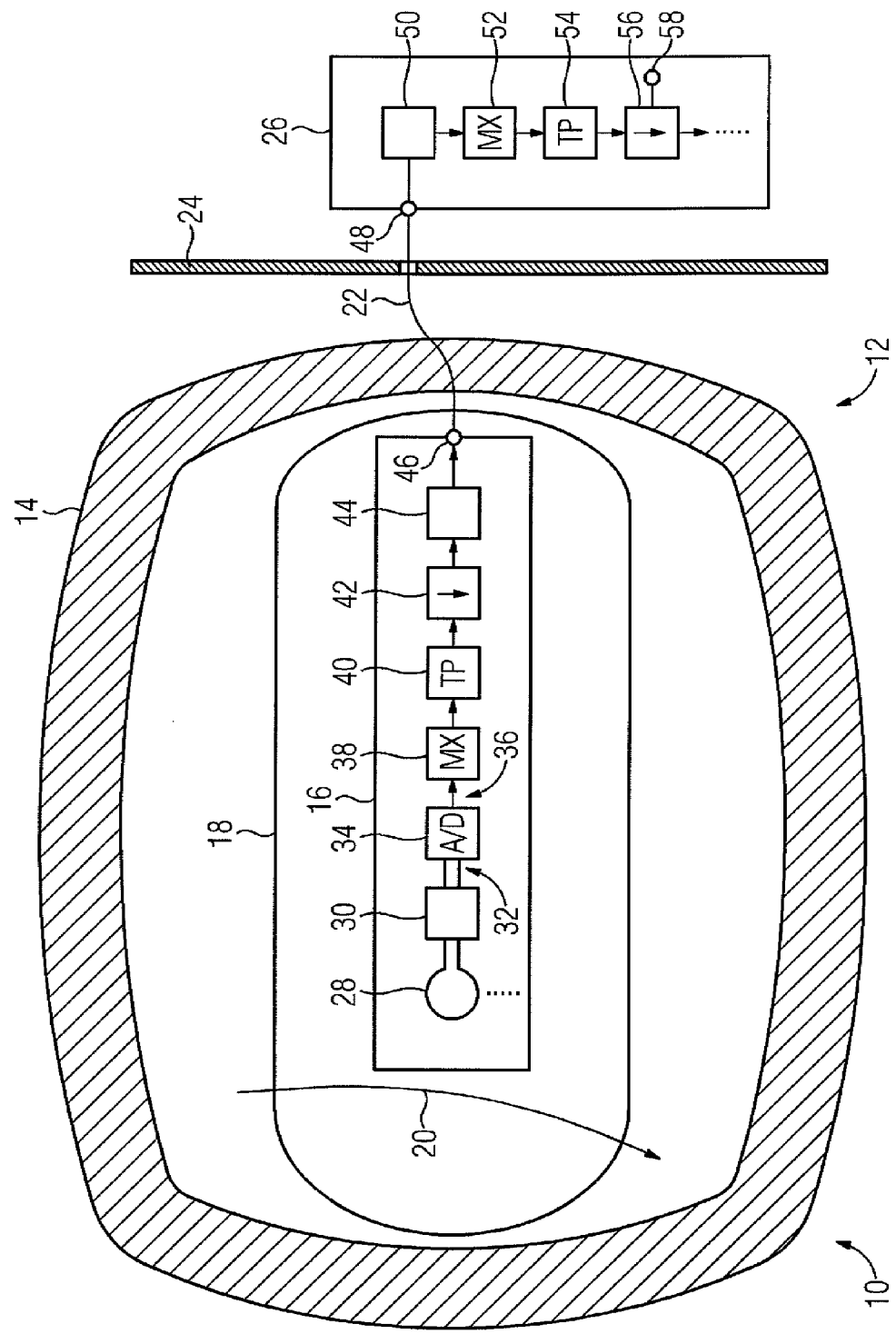

MAGNETIC RESONANCE TOMOGRAPHY SYSTEM, RECEIVE APPARATUS AND METHOD

This application claims the benefit of DE 10 2011 086 288.9, filed on Nov. 14, 2011, which is hereby incorporated by reference.

BACKGROUND

The present embodiments relate to a magnetic resonance tomography system.

An MRT system and a corresponding receive apparatus are known from DE 199 11 988 A1, for example.

A system for creating magnetic resonance tomograms may be formed from at least two parts separated spatially from one another. The first part includes a device for generating a magnetic field that may create a magnetic resonance in a body to be examined (e.g., a body of a human or animal patient) or in a material sample. It is difficult to operate complex electronic circuits or even computer systems for the computation of tomograms close to the body. These systems interfere with the receive apparatus, with which the magnetic resonance signal (e.g., MR signal) emitted as a result of the magnetic resonance is received. This area, in which the use of potential interfering circuits is to be avoided, is referred to as the measurement field. To process the MR signal (e.g., for editing the image information contained therein), the signal is transmitted out of the measurement field to an evaluation device (e.g., a computer system) that is located in an area shielded as regards RF (e.g., from which no interfering high-frequency radiation (RF radiation) may get into the measurement area). The spatial distances to be spanned in such cases may amount to 5 m and more.

The MR signal contains the desired image information in a specific frequency band, the mid frequency of which depends on a field strength of the basic magnetic field or $B_0$ magnetic field. A bandwidth of the frequency band is produced by the gradient fields that are generated by gradient coils of the MRT system. For digital editing of the MR image information by the evaluation unit, the MR signal or a signal derived therefrom are to be converted into a digital signal using an analog/digital converter.

It is known from the above publication that an analog/digital converter may be placed close to the receive coil in such cases, and the high-frequency MR signal may be sampled directly in this way in order to reduce the analog circuit outlay. The digital sampling values obtained by the A/D converter may then be exported from the magnetic field, for example, via a serial data link to the evaluation device. However, high A/D converter sampling rates are required for A/D conversion to obtain a high decimation gain (e.g., a marked oversampling of the analog signal by a factor of 2 and greater). These high A/D converter sampling rates require a correspondingly high data transmission rate, which is used for transmission out of the magnetic field. With the ever-increasing field strengths of the basic magnetic field of current MRT systems, however, a mid frequency of the MR signal that may lie in the range of 40 MHz to 500 MHz is produced. Correspondingly fast A/D converters make the manufacturing of the MRT system very expensive. In addition, the long communication links between the A/D converter and the RF-shielded evaluation unit provide that corresponding high-frequency interference signals, which may only be suppressed at great expense, are emitted by the connecting lines.

To obtain the MR image information from the MR signal, the frequency band containing the image information is shifted into a baseband, where the image information may be further processed as a low-frequency signal. A digital mixing down into the baseband close to the examination magnetic field (e.g., within the receive apparatus) is not sensible, since a control connection from the evaluation unit is needed in order to be able to adapt the sampling rate of the A/D converter to the measurement sequence currently being used. The control signal may be emitted from the control connection, may couple into the receive coil element of the receive apparatus via an electromagnetic coupling-in, and may disrupt the MR signal there.

SUMMARY AND DESCRIPTION

The present embodiments may obviate one or more of the drawbacks or limitations in the related art. For example, image information may be obtained more simply.

The MRT system includes at least one receive coil element that is coupled to an input of an analog/digital converter. The at least one receive coil is provided in a receive apparatus disposed in a magnetic field, so that a magnetic resonance (MR) signal of the receive coil element (e.g., without previous analog mixing down) is convertible into a digital MR signal.

The digital MR signal is not now transmitted, however, directly out of the magnetic field to the RF-shielded evaluation device. Instead, a digital output of the analog/digital converter is connected via a digital mixer device and a clock reduction device to the data output of the receive apparatus, from which the processed data is transmitted to the evaluation device. The mixer device is configured to mix a pre-specified frequency band of the MR signal downwards into an intermediate frequency range and, through this, to generate a digital intermediate frequency signal (e.g., an IF signal). This mixed-down IF signal is reduced in clock rate by the clock rate reduction device.

The MRT system allows the following method for obtaining MR image information to be performed. In the MR signal received by the receive coil element, the image information is in a frequency range defined by the field strength of the basic magnetic field and the gradient fields. By direct sampling of the MR signal of the receive coil by the A/D converter, the MR image information continues to be located within this comparatively high-frequency frequency band. The term direct conversion provides, for example, that before the A/D conversion, the MR signal is not already modulated on the analog side by a mixer. This frequency band is shifted by the digital mixer device by downwards mixing into a pre-specified intermediate frequency range. Thus, without any problem, the IF signal may be reduced using the clock reduction device in the clock rate and the clock-rate-reduced IF signal may be emitted from the magnetic field with a far lower transmission bandwidth than would be possible if the output signal of the A/D converter were to be transmitted directly.

A large number of constructional simplifications is produced in an MRT system if the frequency band with the MR image information is not mixed down in one stage from the high-frequency range into the baseband, but a digital mixing-down into the baseband in two stages is carried out (e.g., first into an intermediate frequency band in the area of the magnetic field and subsequently, after transmission out of the magnetic field, into the baseband).

Thus, for example, the clock rate reduction for the IF signal does not have to be designed to be variable. Instead, the clock rate reduction for the IF signal may be designed very simply as clock rate reduction with a fixed reduction factor. A whole-number reduction factor may be provided, so that the clock-rate-reduced IF signal may be generated by simply omitting individual values of the digital IF signal. A clock rate reduction, in which only every sixth or every eighth received input value is output as an output value, may be provided.

The mixer device for mixing down or demodulating the MR signal into the IF signal may be constructed in the simplest possible manner and may consume as little energy as possible. Otherwise, waste heat results in a thermal noise that may influence the image quality of the MRT system. Accordingly, in one embodiment, the mixer device may have a weighting device that is configured to generate the IF signal by multiplying consecutive values of the MR signal by corresponding values from a periodic value sequence formed from the values 1 and −1 (e.g., 1, −1, 1, −1, 1, −1 . . . ) or the values 0, 1, 0, −1 (e.g., 0, 1, 0, −1, 0, 1, 0, −1, 0, 1, 0, −1 . . . ). The digital mixer may, for example, be achieved by multiplication by the simple values 0, 1 and −1. The digital mixer may also be achieved by multiplexing, in which a 0 is followed by an A/D converter output data item. This is followed by a 0, and this is followed by an inverted A/D converter output data item if the value sequence 1, 0, −1, 0 is used. Thus, this mixing down corresponds to a multiplication by a local oscillator signal, the frequency of which corresponds to a quarter of the sampling frequency of the A/D converter.

In one embodiment, the A/D converter is configured for an oversampling of the MR signal. This allows the downstream components of the receive apparatus to be embodied even more simply, as is explained more precisely below.

The IF signal is filtered after mixing down and before sampling rate reduction using a lowpass filter in order to damp out undesired mixing products in the signal, which would otherwise lead in clock rate reduction to a deconvolution. A digital finite-impulse-response (FIR) filter uses little computing power and thus forms a simple variant operable in a receive apparatus. A cascaded-integrator-comb-filter (CIC) filter (CIC—Cascaded-Integrator-Comb-Filter) may also be used. This may also be implemented in the use described without a multiplier. If an oversampling is also provided by the A/D converter, few coefficients may be provided in the filters, since the smaller rate of change of the frequency responses of the filters is not disadvantageously noticeable because of the oversampling.

In order to also enable the components of the magnetically shielded evaluation device to be configured in a simpler manner, the oversampling may be preserved by suitable selection of the pulse duty factor of the clock rate reduction.

For the transmission of the digital values generated by the clock reduction device (e.g., the clock-reduced IF signal), over the comparatively long connection lines through to the evaluation device, the receive apparatus may include a scrambling device, through which scrambled data may be generated at the data output of the receive apparatus. The randomization of the values produced through this prevents coupling-in of correlated interferences into the analog signal path of the receive apparatus (e.g., into the receive coil and possibly into any gain equalization and bandpass filtering downstream from this apparatus).

In one embodiment, the receive apparatus may include a dithering device, through which dithering of the time intervals of consecutive digital data values transmitted at the output may be generated. This enables harmonic interference signals, which may otherwise be emitted by the periodic sending out of individual digital values over the connecting lines, to be avoided. The dithering of the time intervals provides that the harmonic interference signals are unregularized, so that periodically emitted interference pulses form to a lesser degree.

When the described, comparatively simply-constructed components are used for signal processing, irregular frequency responses may be produced in the signal path, through which the signal portions that contain image information may also be distorted. One embodiment of the MRT system, however, has the advantage that the distortions may also be removed simply. In one embodiment of the MRT system, a digital equalizer may be provided. This is sufficient to compensate for the signal distortions possibly caused by the components described. The equalizer in such cases may be provided in the receive apparatus or on the evaluation device side.

As regards the evaluation device, the device is also shielded in the MRT system from the measurement field. The data output of the receive apparatus for transmission of the clock-rate-reduced and possibly scrambled IF signal over a data transmission device (e.g., an optical waveguide) is coupled to the data input of the evaluation device. To obtain the desired image information from the clock-rate-reduced IF signal, the evaluation device has a second mixer device for mixing down the clock-rate-reduced IF signal into a baseband signal and also a further device for clock rate reduction. The second clock rate reduction device is embodied to carry out a variable clock rate reduction, as is desired in conventional MRT systems. Since the evaluation device is located at a large distance from the measurement field in an area shielded as regards RF, the evaluation device may be supplied far more simply with energy and have accordingly more powerful signal processing components.

The receive apparatus of the MRT system may be embodied in one or more parts. With a multi-part embodiment, the receive coil may be embodied as freely-movable (e.g., as a probe that, in the case of an MRT system for medical examinations, may be attached firmly to a patient by a bandage on the body). The A/D converter may be disposed in the patient couch, for example, or in another area of the magnet device.

A one-piece embodiment of the receive apparatus may also be provided in order, for example, to enable a receive coil array with receive coils disposed in fixed geometrical relationships to one another. The MR signal of the receive coil array is converted entirely within the receive apparatus into IF signals to enable the IF signals to be transmitted with little wiring outlay to the rest of the MRT system. A receive apparatus for such an MRT system, in which the at least one receive coil of the receive apparatus together with the analog/digital converter and the mixer device belonging to the converter disposed downstream of the respective receive coil and the clock rate reduction device disposed downstream thereof are all disposed in a common housing.

The receive apparatus may thus be freely disposed on a body to be examined in this case and may be coupled via a comparatively thin and flexible cable (e.g., a coaxial cable or an optical waveguide) to the evaluation device. Instead of a cable, the data of the clock-rate-reduced IF signal may be transmitted via a wireless optical connection or a radio connection from the magnetic field to the evaluation device.

Embodiment of the receive apparatus also include features that have already been described in conjunction with the MRT system. These developments are therefore not described separately once again here.

BRIEF DESCRIPTION OF THE DRAWINGS

FIG. 1 shows one embodiment of a magnetic resonance tomography system.

DETAILED DESCRIPTION OF THE DRAWINGS

In a tomograph 10, a magnet 14 and a receive apparatus 16 are located in an examination room 12. The receive apparatus 16 is disposed close to the body 18. The body 18 and the receive apparatus 16 are located in a magnetic field 20 of the magnet 14. The magnet 14 may, for example, involve a plurality of magnetic coils. One magnetic coil of the plurality of magnetic coils generates a basic magnetic field $B_0$ and other magnetic coils of the plurality of magnetic coils generate coil gradient fields and RF alternating fields, as are used overall for inducing magnetic resonance in the body 18. The body 18 may, for example, involve a part of the body of a patient not shown in any greater detail.

The magnetic alternating field emitted as a result of the magnetic resonance by the body 18 is received by the receive apparatus 16 and is converted into a digital signal that is transmitted over a communication link 22 through shielding for RF radiation (e.g., RF shielding) to an evaluation device 26. The evaluation device 26 may, for example, be a personal computer or a comparable computing system. Image data for a magnetic resonance tomogram is computed by the evaluation unit 26 from the received digital signal. This may, for example, be displayed to a user of the tomograph 10 on a screen (not shown).

The tomograph 10 may include further similar receive apparatuses in addition to the receive apparatus 16. Only the receive apparatus 16 is described by way of example below.

The receive apparatus 16 generates the digital signal from an analog receive signal of a receive coil 28 that converts the magnetic alternating field emitted from the body 18 into an electrical signal. In addition to the receive coil 28, the receive apparatus 16 may have further receive coils and components subordinate to the coils, as is shown by ellipsis points in the FIGURE. For the sake of clarity, only the signal path for the one receive coil 28 is described below.

The analog AC voltage signal of the coil 28 is adapted in the known way by a gain equalization and bandpass filtering 30, such that the analog AC voltage signal has a suitable dynamic for controlling an analog input 32 of an analog/digital converter 34 (e.g., an A/D converter). An output 36 of the A/D converter 34 is coupled to a digital mixer 38, which mixes the digital output signal of the A/D converter 34 digitally into an intermediate frequency band. The high-frequency mixer products are attenuated by digital filtering by a downstream lowpass filter 40. Connected downstream from the lowpass filter 40 is a fixed sampling rate reduction 42. A transmit device 44 edits the clock-rate-reduced signal for a transmission over the communication link 22. The communication link 22 is connected for this purpose to a digital data output 46 on the receive apparatus 16.

The digital mixer 38 may be implemented by multiplication by the four values +1, 0, −1, 0 or by multiplexing of an item of A/D converter data, a zero and, omitting an item of converter output data, an inverted next item of converter data and a further zero. An expensive numerically-controllable oscillator is not needed for this form of down mixing. The mixing carried out by the mixer 38 in this way corresponds to a multiplication by a sine-wave signal, the frequency of which amounts to a quarter of the sampling frequency of the A/D converter.

The lowpass filter 40 before sampling rate reduction 42 may be realized by a digital FIR filter or by a cascaded integrator comb filter (e.g., CIC filter).

Each eighth sample value is extracted by the clock reduction 42 from the data of the lowpass-filtered signal in the example shown. The sampling rate is selected such that the requirements for the rate of change of the lowpass filter 40 are not especially high, so that the lowpass filter 40 only has comparatively few filter coefficients.

The signal mixed down and reduced in clock rate is routed serially out of the magnetic field 20 with the data rate reduced in this way over the communication link 22.

The evaluation device 26 receives the digital signal from the communication link 22 via an input 48, from which the digital signal is conveyed to a pre-processing device 50. The processing carried out by the transmit device 44 for the signal transmission are reversed again by the pre-processing device 50. Thus, the transmit device 44 may scramble the data, and the pre-processing device 50 may carry out a corresponding descrambling. This avoids a fault in the analog signal path of the receive apparatus 16 and the other receive apparatuses during the transmission over the communication link 22. A further method for avoiding interference signals may include the introduction of a jitter by the transmit device 44, so that data packets are not sent at fixed intervals over the communication link 22, but the time interval is varied in accordance with the random principle. This dithering is compensated for again by the pre-processing device 50.

The receiver apparatus 16 and the evaluation device 26 may only be coupled at high resistance over the communication link 22 or even electrically decoupled. This prevents the formation of a common-mode current in electrically-conducting components of the communication link 22. The communication link 22 may involve a wired or capacitive link. An optical link via an optical waveguide may also be provided. The communication link 22 may also be embodied wirelessly as an optical connection with laser beam transmission or as a radio link.

The output signal of the pre-processing device 50 is fed to a second signal processing stage, in which the signal is mixed down by a digital mixer 52 into a baseband, filtered digitally by a lowpass filter 54 and clocked down by a variable sampling rate reduction 56. The output signal of the sampling rate reduction 56 is fed to image processing for creating the magnetic resonance tomogram not illustrated in any greater detail in the FIGURE. In sampling rate reduction 56, a control input 58 is coupled to a control apparatus for the magnetic coil of the magnet 14, through which the sampling rate reduction 56 is adapted to a sequence selected for the examination of the body 18.

Before the digital mixing 52 and filtering 54 in the second stage, an equalizing filter may equalize a possible undesired frequency response in a useful signal band, such as may be caused, for example, by a CIC filter in the lowpass 40. This equalizing filter may also equalize the frequency response of the receive coil 28, a preamplifier in the pre-processing circuit 30 and the rest of the analog signal path as well. The equalizing filter may be provided for this purpose in the transmit device 44 or the pre-processing device 50.

The individual components of the receive apparatus 16 and the evaluation device 26 may be realized by known elements known. For example, the digital components may be realized by corresponding processing programs of a digital signal processor or a field programmable gate array (FPGA).

For the tomograph 10, the functioning of the two-stage digital mixing-down of the MR signal of the receive coil 28 into the baseband is explained below with reference to concrete numerical examples.

It may be assumed that, for the magnet 14, the basic magnetic field has, for example, a field strength of 0.5 T. A mid frequency of the MR signal that the body 18 emits at this magnetic field strength lies at approximately 21.3 MHz, for example. The MR signal is limited by a bandpass of the pre-processing circuit 30 to a useful band, in which the image information is located. This frequency band may, for example, have a width of +/−250 kHz around the mid-frequency. During sampling by the A/D converter 34 with, for example, a sampling frequency of 80 MHz, the useful signal band remains in the range of 21.3 MHz. For the described mixing with a quarter of the sampling frequency (e.g., with 20 MHz), the useful band is transferred or shifted into the range of 1.05 MHz to 1.55 MHz. According to Nyquist, only a sampling rate of 3.1 MHz will be used. In order to preserve the gain by the oversampling (e.g., sampling at 80 MHz at a signal bandwidth of less than 2 MHz) during the data reduction, the signal of the mixer 38 is fed to the lowpass filter 40, which suppresses the sum mixed product (e.g., 21.3 MHz+20 MHz). As already described, the clock reduction 42 forwards every eighth sample value from the lowpass-filtered signal. Thus, the sampling rate of the clock-rate-reduced signal amounts to 10 MHz and thus lies far above the minimal sampling rate pre-specified by the Nyquist criterion.

Laid out below in a table for a more general explanation are the widely-used magnetic field strengths for current MRT systems with the associated, measured MR frequencies. The MR frequency may be directly proportional to the magnetic field strength of the magnetic field 20. The exact field strength may, however, be selected so that frequency ranges of the useful band that are occupied by broadcast radio or other radio services are not produced. Therefore, the direct proportionalities are not given in the table.

| Field strength | MR frequency | Sampling frequency | 1st mixer frequency | 1st intermediate frequency | Reduced sampling frequency |
| --- | --- | --- | --- | --- | --- |
| 0.5 T | ~21.3 MHz | 80 MHz | 20 MHz | 1.3 MHz | 10 MHz |
| 1 T | ~42.6 MHz | 60 MHz | 15 MHz | 2.4 MHz | 10 MHz |
| 1.5 T | ~63.6 MHz | 80 MHz | 20 MHz | 3.6 MHz | 10 MHz |
| 3 T | ~123.2 MHz | 160 MHz | 40 MHz | 3.2 MHz | 10 MHz |

As shown in the table, a suitable choice of sampling frequency and application of a first mixing in mixer 38 with a quarter of the sampling frequency allows an intermediate frequency to be obtained that, in accordance with Nyquist, may always be represented lossless with a reduced sampling rate of 10 MHz of 10 MSamples/s.

The examples show how it is possible overall, without great shielding measures, to accommodate a first A/D converter with a downstream first mixer stage close to a receive coil and to export the data obtained in this way at low cost out of the interference-critical area.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance tomography (MRT) system comprising:
    a device for creating a magnetic field, through which a magnetic resonance is creatable in a body; and
    a receive apparatus disposed in the magnetic field, at least one receive coil of the receive apparatus configured for receiving an MR signal of the body being coupled to an input of an analog/digital converter,
    wherein the analog/digital converter is configured to convert the MR signal into a digital MR signal by direct converting,
    wherein a digital output of the analog/digital converter is coupled via a digital mixer device and a clock rate reduction device to a data output of the receive apparatus,
    wherein the digital mixer device is configured to mix a predetermined frequency band of the MR signal downwards into an intermediate frequency range and to generate a digital intermediate frequency (IF) signal, and
    wherein the data output of the receive apparatus is coupled via a data transmission device to a data input of an RF-shielded evaluation device.

2. The MRT system as claimed in claim 1, wherein the clock rate reduction device has a fixed reduction factor.

3. The MRT system as claimed in claim 2, wherein the fixed reduction factor comprises a whole-number reduction factor.

4. The MRT system as claimed in claim 3, wherein the clock rate reduction device is operable to output every sixth or eighth received input value as an output value.

5. The MRT system as claimed in claim 1, wherein the digital mixer device includes a weighting device configured to generate consecutive output values as the IF signal, the consecutive output values corresponding to consecutive values of the MR signal, which are weighted with a corresponding value from a periodic sequence of values formed from the values 1, −1 or 1, 0, −1, 0.

6. The MRT system as claimed in claim 1, wherein the analog/digital converter is configured for an oversampling of the MR signal.

7. The MRT system as claimed in claim 1, wherein the digital mixer device and the clock rate reduction device are coupled via a digital finite impulse response (FIR) filter.

8. The MRT system as claimed in claim 7, wherein the FIR filter comprises a cascaded integrator-comb (CIC) filter.

9. The MRT system as claimed in claim 1, wherein an oversampling is preserved by the clock rate reduction device.

10. The MRT system as claimed in claim 1, wherein the receive apparatus comprises a scrambling device, through which scrambled data is creatable at the data output.

11. The MRT system as claimed in claim 1, wherein the receive apparatus comprises a dithering device, through which a dithering of time intervals of data values transmitted consecutively at the data output is creatable.

12. The MRT system as claimed in claim 1, further comprising a digital equalizer.

13. The MRT system as claimed in claim 1, wherein the RF-shielded evaluation device comprises a second mixer device for mixing down a clock-rate-reduced IF signal received by the data transmission device into a baseband signal and also a device for variable clock rate reduction.

14. A receive apparatus for a magnetic resonance tomography (MRT) system, the MRT system comprising:
    a device for creating a magnetic field, through which a magnetic resonance is creatable in a body; and
    a receive apparatus disposed in the magnetic field, at least one receive coil of the receive apparatus configured for receiving an MR signal of the body being coupled to an input of an analog/digital converter, wherein the analog/digital converter is configured to convert the MR signal into a digital MR signal by direct converting, wherein a digital output of the analog/digital converter is coupled via a digital mixer device and a clock rate reduction device to a data output of the receive apparatus, wherein the digital mixer device is configured to mix a predetermined frequency band of the MR signal downwards into an intermediate frequency range and to generate a digital intermediate frequency (IF) signal, wherein the at least one receive coil, together with the analog/digital converter subordinate to the at least one receive coil and the associated digital mixer device, and the clock rate reduction device subordinate to the associated digital mixer device, are disposed in a common housing and, because of this, the receive apparatus is disposable freely on a body to be examined, and wherein the data output of the receive apparatus is coupled via a data transmission device to a data input of an RF-shielded evaluation device.

15. The receiving apparatus as claimed in claim 14, wherein the clock rate reduction device has a fixed reduction factor.

16. The MRT system as claimed in claim 15, wherein the fixed reduction factor comprises a whole-number reduction factor.

17. The MRT system as claimed in claim 16, wherein the clock rate reduction device is operable to output every sixth or eighth received input value as an output value.

18. The MRT system as claimed in claim 14, wherein the digital mixer device includes a weighting device configured to generate consecutive output values as the IF signal, the consecutive output values corresponding to consecutive values of the MR signal, which are weighted with a corresponding value from a periodic sequence of values formed from the values 1, −1 or 1, 0, −1, 0.

19. The MRT system as claimed in claim 14, wherein the analog/digital converter is configured for an oversampling of the MR signal.

20. A method for obtaining magnetic resonance (MR) image information in a magnetic resonance tomography (MRT) system, the method comprising:

receiving, by at least one coil of a receive apparatus, an MR signal that a body in a magnetic field sends out as a result of magnetic resonance;

direct converting, using an analog/digital converter, the MR signal within the magnetic field directly into a digital MR signal; and shifting a frequency band of the digital MR signal containing MR information into a pre-specified intermediate frequency (IF) range by downwards mixing, the IF signal obtained being reduced in a clock rate, and the clock-rate-reduced IF signal being taken out of the magnetic field, wherein a data output of the receive apparatus is coupled via a data transmission device to a data input of an RF-shielded evaluation device.

* * * * *